United States Patent
Liu et al.

(10) Patent No.: US 10,320,351 B1
(45) Date of Patent: Jun. 11, 2019

(54) SWITCH FOR CONTROLLING A GAIN OF AN AMPLIFIER AND METHOD THEREOF

(71) Applicant: Beken Corporation, Shanghai (CN)

(72) Inventors: Jiazhou Liu, Shanghai (CN); Donghui Gao, Shanghai (CN)

(73) Assignee: Beken Corporation, Shanghai (CN)

( * ) Notice: Subject to any disclaimer, the term of this patent is extended or adjusted under 35 U.S.C. 154(b) by 0 days.

(21) Appl. No.: 15/853,960

(22) Filed: Dec. 26, 2017

(30) Foreign Application Priority Data

Dec. 11, 2017 (CN) .......................... 2017 1 1310098

(51) Int. Cl.
*H03G 3/00* (2006.01)
*H03G 3/30* (2006.01)
*H03F 1/02* (2006.01)
*H03F 3/21* (2006.01)
*H03F 3/19* (2006.01)
*H03F 1/30* (2006.01)
*H03F 3/72* (2006.01)

(52) U.S. Cl.
CPC ............ *H03G 3/30* (2013.01); *H03F 1/0261* (2013.01); *H03F 1/303* (2013.01); *H03F 3/19* (2013.01); *H03F 3/21* (2013.01); *H03F 1/0277* (2013.01); *H03F 3/72* (2013.01)

(58) Field of Classification Search
CPC .. H03G 3/30; H03F 1/303; H03F 3/19; H03F 1/0261; H03F 3/21
USPC ................. 330/284, 144, 145, 51, 282, 86
See application file for complete search history.

(56) References Cited

U.S. PATENT DOCUMENTS 6,147,558 A * 11/2000 Sculley ................ H03G 1/0088
330/284
6,697,612 B2 * 2/2004 Nicollini ............. H04M 1/6016
455/310

* cited by examiner

*Primary Examiner* — Khanh V Nguyen
*Assistant Examiner* — Khiem D Nguyen
(74) *Attorney, Agent, or Firm* — Schwegman Lundberg & Woessner, P.A.

(57) ABSTRACT

A switch for controlling a gain of an amplifier comprises a first NMOS transistor, a second NMOS transistor, a third PMOS transistor, a fourth NMOS transistor, a fifth PMOS transistor, a first resistor, and an inverter. A source of the first NMOS transistor is connected to a first terminal of the first resistor, a drain of the first NMOS transistor is connected to a drain of the third PMOS transistor, a source of the fourth NMOS transistor and a source of the second NMOS transistor, a gate of the first NMOS transistor is connected to a source of the third PMOS transistor, a drain of the fifth PMOS transistor, a drain of the fourth NMOS transistor, and a gate of the second NMOS transistor; a gate of the third PMOS transistor receives a switch voltage (Vs); a gate of the fourth PMOS transistor receives a negative switch voltage (Vsn).

9 Claims, 5 Drawing Sheets

SWITCH FOR CONTROLLING A GAIN OF AN AMPLIFIER AND METHOD THEREOF

CROSS-REFERENCE TO RELATED APPLICATIONS

This application claims priority to Chinese Application number 201711310098.0 entitled "Switch for Controlling a Gain of an Amplifier and Method Thereof," filed on Dec. 11, 2017 by Beken Corporation, which is incorporated herein by reference.

TECHNICAL FIELD

The present application relates to a digital circuit and more particularly, but not exclusively, to a switch for controlling a gain of an amplifier and method thereof.

BACKGROUND OF THE INVENTION

In a conventional amplifier, a switch is used to control a gain or other parameters of the amplifier. The switch may be implemented by a N-channel metal oxide semiconductor field effect transistors (NMOSFET). In some circumstances, the switch may have a too high switched-on voltage to be turned on and work properly. Therefore it is desirable to have a switch for controlling a gain of the amplifier that can work properly.

BRIEF DESCRIPTION OF THE INVENTION

In an aspect of an embodiment, a switch for controlling a gain of an amplifier, comprising a first NMOS transistor, a second NMOS transistor, a third PMOS transistor, a fourth NMOS transistor, a fifth PMOS transistor, a first resistor, and an inverter; wherein a source of the first NMOS transistor is connected to a first terminal of the first resistor, a drain of the first NMOS transistor is connected to a drain of the third PMOS transistor, a source of the fourth NMOS transistor and a source of the second NMOS transistor, a gate of the first NMOS transistor is connected to a source of the third PMOS transistor, a drain of the fifth PMOS transistor, a drain of the fourth NMOS transistor, and a gate of the second NMOS transistor; a gate of the third PMOS transistor is configured to receive a switch voltage (Vs); a gate of the fourth PMOS transistor is configured to receive a negative switch voltage (Vsn); a gate of the fifth PMOS transistor is connected to an output node of the inverter, and the inverter is configured to receive the switch voltage; a drain of the second NMOS transistor is connected to a negative input node of the amplifier; and wherein a second terminal of the first resistor is configured to receive an input voltage (Vin), and a gain of the amplifier is adjusted according the switch voltage by switching on or off both the first NMOS transistor and the second NMOS transistor together, wherein the gain represents the ratio of an output voltage of the amplifier to the input voltage; wherein the drain of the second NMOS transistor is further configured to output a switch signal based on the switch voltage to the amplifier.

In another aspect of an embodiment, a switch assembly for controlling a gain of an amplifier, wherein the switch assembly including a plurality of switches, each switch comprises a first NMOS transistor, a second NMOS transistor, a third PMOS transistor, a fourth NMOS transistor, a fifth PMOS transistor, a first resistor, and an inverter; wherein a source of the first NMOS transistor is connected to a first terminal of the first resistor, a drain of the first NMOS transistor is connected to a drain of the third PMOS transistor, a source of the fourth NMOS transistor and a source of the second NMOS transistor, a gate of the first NMOS transistor is connected to a source of the third PMOS transistor, a drain of the fifth PMOS transistor, a drain of the fourth NMOS transistor, and a gate of the second NMOS transistor; a gate of the third PMOS transistor is configured to receive a switch voltage (Vs); a gate of the fourth PMOS transistor is configured to receive a negative switch voltage (Vsn); a gate of the fifth PMOS transistor is connected to an output node of the inverter, and the inverter is configured to receive the switch voltage; a drain of the second NMOS transistor is connected to a negative input node of the amplifier; and wherein a second terminal of the first resistor is configured to receive an input voltage (Vin), the drain of the second NMOS transistor is further configured to output a switch signal based on the switch voltage to the amplifier; wherein the plurality of switches are connected in parallel between the input node of the amplifier and an input node of the switch that receives the input voltage, and a gain of the amplifier is adjusted according the plurality of switch voltages corresponding to the plurality of switches in the switch assembly by switching on or off both the first NMOS transistor and the second NMOS transistor together in each of the switch, wherein the gain represents the ratio of an output voltage of the amplifier to the input voltage.

In another aspect of an embodiment, a method in a switch for controlling a gain of an amplifier, where the switch comprises a first NMOS transistor, a second NMOS transistor, a third PMOS transistor, a fourth NMOS transistor, a fifth PMOS transistor, a first resistor, and an inverter; wherein a source of the first NMOS transistor is connected to a first terminal of the first resistor, a drain of the first NMOS transistor is connected to a drain of the third PMOS transistor, a source of the fourth NMOS transistor and a source of the second NMOS transistor, a gate of the first NMOS transistor is connected to a source of the third PMOS transistor, a drain of the fifth PMOS transistor, a drain of the fourth NMOS transistor, and a gate of the second NMOS transistor; a gate of the third PMOS transistor is configured to receive a switch voltage (Vs); a gate of the fourth PMOS transistor is configured to receive a negative switch voltage (Vsn); a gate of the fifth PMOS transistor is connected to an output node of the inverter, and the inverter is configured to receive the switch voltage; a drain of the second NMOS transistor is connected to a negative input node of the amplifier; and wherein the method comprises: receiving, by a second terminal of the first resistor, input voltage, and adjusting, according to the switch voltage, a gain of the amplifier by switching on or off the first NMOS transistor and the second NMOS transistor, the gain represents the ratio of an output voltage of the amplifier to the input voltage; and outputting, by the drain of the second NMOS transistor to the amplifier, a switch signal based on the switch voltage.

According to an embodiment, the switch will be turned on properly and will not be overvoltage, therefore can work properly.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Various aspects and examples of the invention will now be described. The following description provides specific details for a thorough understanding and enabling description of these examples. Those skilled in the art will understand, however, that the invention may be practiced without many of these details.

Additionally, some well-known structures or functions may not be shown or described in detail, so as to avoid unnecessarily obscuring the relevant description.

The terminology used in the description presented below is intended to be interpreted in its broadest reasonable manner, even though it is being used in conjunction with a detailed description of certain specific examples of the invention. Certain terms may even be emphasized below, however, any terminology intended to be interpreted in any restricted manner will be overtly and specifically defined as such in this Detailed Description section.

Figure 1:
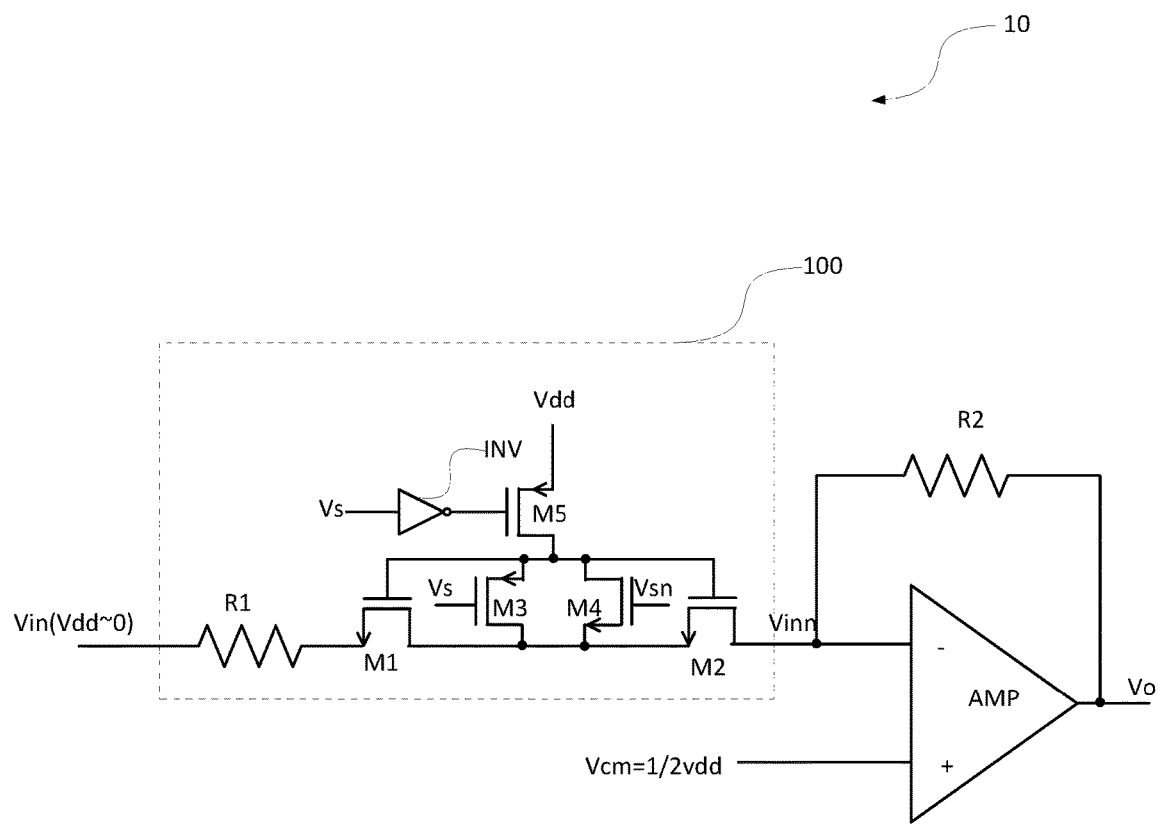
FIG. 1 is a circuit diagram including a switch and an amplifier according to an embodiment of the invention.

FIG. 1 is a circuit diagram of a circuit 10 including a switch 100 and an amplifier according to an embodiment of the invention. The switch 100 comprises a first NMOS transistor M1, a second NMOS transistor M2, a third PMOS transistor M3, a fourth NMOS transistor M4, a fifth PMOS transistor M5, a first resistor R1, and an inverter INV. The source of the first NMOS transistor M1 is connected to a first terminal of the first resistor R1. A drain of the first NMOS transistor M1 is connected to a drain of the third PMOS transistor M3, a source of the fourth NMOS transistor M4 and a source of the second NMOS transistor M2. A gate of the first NMOS transistor M1 is connected to a source of the third PMOS transistor M3, a drain of the fifth PMOS transistor M5, a drain of the fourth NMOS transistor M4, and a gate of the second NMOS transistor M2.

A gate of the third PMOS transistor M3 is configured to receive a switch voltage Vs. A gate of the fourth PMOS transistor M4 is configured to receive a negative switch voltage (Vsn). A gate of the fifth PMOS transistor M5 is connected to an output node of the inverter INV. The inverter INV is configured to receive the switch voltage Vs. A drain of the second NMOS transistor M2 is connected to a negative input node Vinn of the amplifier AMP. The input voltage of the amplifier AMP is designed as ½Vdd, which is the common mode voltage (Vcm). The positive input port of the amplifier AMP is configured to receive Vcm, which equals ½Vdd. Alternatively, the input voltage of the positive input port of the amplifier AMP may take other values.

A second terminal of the first resistor R1 is configured to receive an input voltage Vin. A gain of the amplifier AMP is adjusted according the switch voltage Vs by switching on or off both the first NMOS transistor M1 and the second NMOS transistor M2 together, wherein the gain represents the ratio of an output voltage Vo of the amplifier AMP to the input voltage Vin. The drain of the second NMOS transistor M2 is further configured to output a switch signal to the negative input node Vinn of the amplifier AMP based on the switch voltage Vs. Note the drain of the second NMOS transistor M2 is a virtual ground point.

Alternatively or additionally, both the first NMOS transistor M1 and the second NMOS transistor M2 are core devices, and the first NMOS transistor and the second NMOS transistor have a working voltage of about 1.2V. For example, core device can be defined by factories. Core devices are devices that can reach the minimum line width. For example, in 55 nm process, the minimum line width is 55 nm. Therefore the core device can reach the minimum line width of 55 nm. Further, the withstand voltage of the core device is the same as the withstand voltage for the process, that is 1.2V. As the external interface voltage cannot change with the improvement of process, in order to address this situation, IO devices are designed for interface circuit. IO devices have higher withstand voltage, such as 2.5V or 3.3V for 55 nm IO devices.

Alternatively or additionally, the third PMOS transistor M3, the fourth NMOS transistor M4 and the fifth PMOS transistor M5 are I/O devices, and third PMOS transistor M3, the fourth NMOS transistor M4 and the fifth PMOS transistor M5 have a working voltage of about 2V to 3V.

Alternatively or additionally, the switch voltage Vs is configured to vary between a power source voltage (Vdd) and a ground voltage (0) to adjust a gain of the amplifier AMP by switching on or off the first NMOS transistor M1 and the second NMOS transistor M2.

Figure 2:
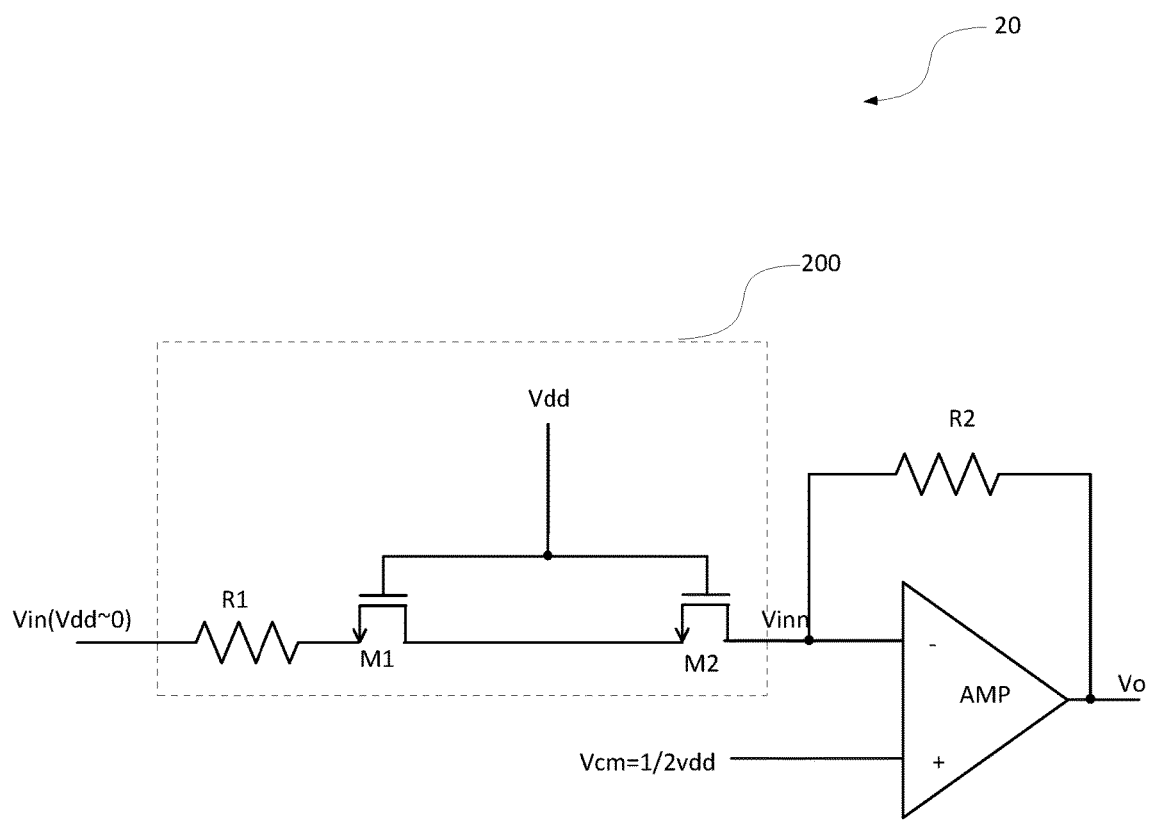
FIG. 2 is a simplified circuit diagram including a switch in a switched-on state and an amplifier according to an embodiment of the invention.

FIG. 2 is a simplified circuit diagram of a circuit 20 including a switch 200 in a switched-on state and an amplifier according to an embodiment of the invention.

In FIG. 2, when the switch voltage Vs=1 which means vdd, gates of the first NMOS transistor M1 and the second NMOS transistor M2 receive vdd, therefore the first NMOS transistor M1 and the second NMOS transistor M2 are on. Referring back to FIG. 1, further, when the switch voltage Vs=1, the third PMOS transistor M3 and the fourth NMOS transistor M4 are off, and the fifth PMOS transistor is on. FIG. 2 shows the simplified circuit diagram of FIG. 1 by equaling the third PMOS transistor M3 and the fourth NMOS transistor M4 to off (therefore not shown in FIG. 2), and the fifth PMOS transistor M5 to a conductor. Therefore the output voltage Vo of the amplifier AMP can be represented as Vo=−R2/R1*vin, and the gain of the amplifier AMP can be represented as R2/R1.

In FIG. 2, when both the first NMOS transistor M1 and the second NMOS transistor is switched on, the voltage on the gate of both the first NMOS transistor M1 and the second NMOS transistor M2 is about Vdd(2V), therefore both the first NMOS transistor M1 and the second NMOS transistor can be switched-on normally and will not cause overvoltage.

Figure 3:
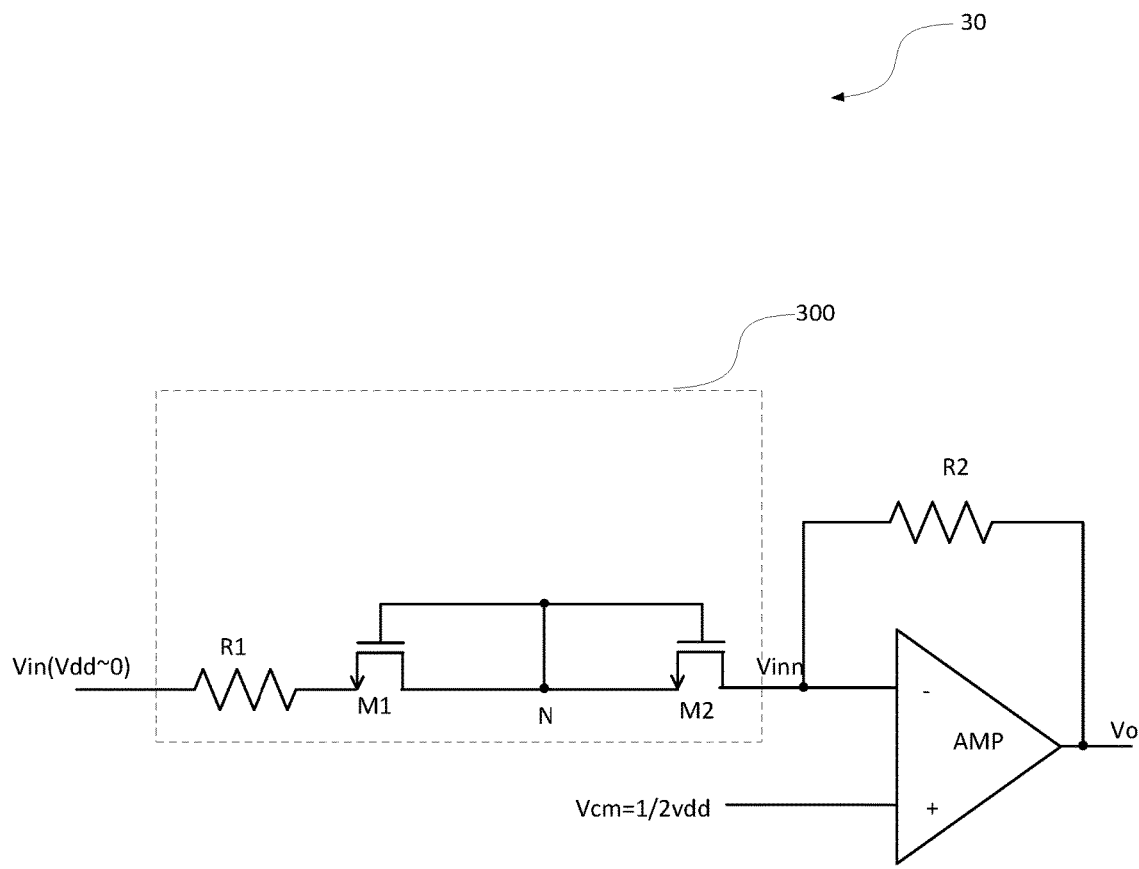
FIG. 3 is a circuit diagram including a switch in a switched-off state and an amplifier according to an embodiment of the invention.

FIG. 3 is a circuit diagram of a circuit 30 including a switch 300 in a switched-off state and an amplifier according to an embodiment of the invention.

In FIG. 3, when the switch voltage Vs=0 which means ground (gnd), then the first NMOS transistor M1 and the second NMOS transistor M2 are off. Referring back to FIG. 1, further, when the switch voltage Vs=0, the third PMOS transistor M3 and the fourth NMOS transistor M4 are on, and the fifth PMOS transistor is off. FIG. 3 shows the simplified circuit diagram of FIG. 1 by equaling the third PMOS transistor M3 and the fourth NMOS transistor M4 to a conductor, and the fifth PMOS transistor M5 to off (therefore not shown in FIG. 3). As the first NMOS transistor M1 and the second NMOS transistor M2 are off, it is equivalent that R1 is infinite, therefore the gain is 0.

In FIG. 3, the voltage on node N is between Vcm+vth and vth. If the input voltage vin is higher than vcm, the voltage on node N is between Vcm (½Vdd) and vdd-vth normally. Since the voltages vgs (voltage between gate and source) of first NMOS transistor M1 is 0, the first NMOS transistor M1 is off. If the input voltage Vin is smaller than Vcm, the voltage on node N is between Vcm (½Vdd) and with vth normally. As the gate and source of the second NMOS transistor M2 are connected, the second NMOS transistor M2 is off.

Figure 4:
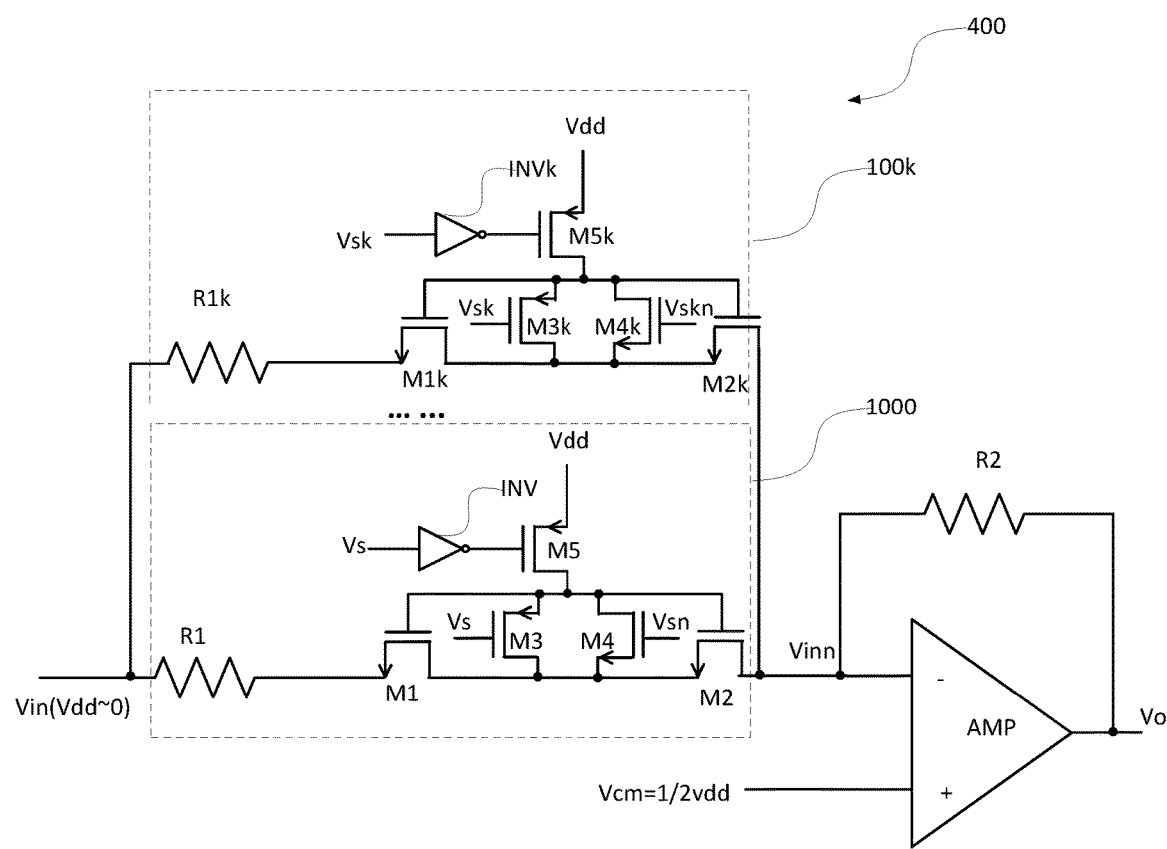
FIG. 4 is a circuit diagram including a switch assembly and an amplifier according to an embodiment of the invention.

FIG. 4 is a circuit diagram showing a switch assembly 400 and an amplifier according to an embodiment of the invention.

The switch assembly 400 comprises a plurality of switches 1000-100k. For example, the switch assembly 400 comprises k switches. The k switches are connected in parallel between the negative input node Vinn of the amplifier AMP and an input node of the switch that receives the input voltage Vin. In addition to the circuit already discussed with respect to FIG. 1, the switch assembly 400 further comprises k-1 switches similar to switch 1000. For ease of description, switches 1001, 1002, . . . , 100(k-2), 100(k-1) are not shown or described. Only switches 1000 and 100k are shown in FIG. 4. k represents an integer. For example, the 100k switch comprises a 1kth NMOS transistor M1k, a 2kth NMOS transistor M2k, a 3kth PMOS transistor M3k, a 4kth NMOS transistor M4k, a 5kth PMOS transistor M5k, a 1kth resistor R1k, and a kth inverter INVk. A source of the 1kth NMOS transistor M1k is connected to a first terminal of the 1kth resistor R1k. A drain of the 1kth NMOS transistor is connected to a drain of the 3kth PMOS transistor M3k, a source of the 4kth NMOS transistor M4k and a source of the 2kth NMOS transistor M2k. A gate of the 1kth NMOS transistor M1k is connected to a source of the 3kth PMOS transistor M3k, a drain of the 5kth PMOS transistor M5k, a drain of the 4kth NMOS transistor M4k, and a gate of the 2kth NMOS transistor M2k.

A gate of the 3kth PMOS transistor M3k is configured to receive a kth switch voltage (Vsk). A gate of the 4kth PMOS transistor M4k is configured to receive a kth negative switch voltage (Vskn). A gate of the 5kth PMOS transistor M5k is connected to an output node of the kth inverter INVk, and the kth inverter INVk is configured to receive the switch voltage Vsk. A drain of the 2kth NMOS transistor M2k is connected to a negative input node Vinn of the amplifier AMP. A second terminal of the 1kth resistor R1k is configured to receive an input voltage Vin. The drain of the 2kth NMOS transistor M2k is further configured to output a switch signal based on the kth switch voltage Vsk to the amplifier AMP.

In general, the plurality of switches 1000, 1001, 1002, . . . , 100(k-2), 100(k-1), 100k are connected in parallel between the input node of the amplifier AMP and an input node of the switch that receives the input voltage Vin. A gain of the amplifier AMP is adjusted according the plurality of switch voltages Vs, Vs1, Vs2 . . . Vsk corresponding to the plurality of switches 1000, 1001, 1002, . . . , 100(k-2), 100(k-1) and 100k in the switch assembly 400 by switching on or off both the first NMOS transistor and the second NMOS transistor together (M1, M2), (M11, M21), (M12, M22), . . . (M1k, M2k) in each of the switch. The gain represents the ratio of an output voltage of the amplifier AMP to the input voltage Vin. For example, the gain may be represented as R2/f(R1, R11, R12, R13, . . . . R1k), depending on switching on or off of the switches 1000, 1001, 1002, . . . 100k. The k switches are adjusted between on and off, so as to control the amount of the input resistances R1, R11, R12, R13, . . . . R1k, therefore changing the gain of the amplifier AMP.

Figure 5:
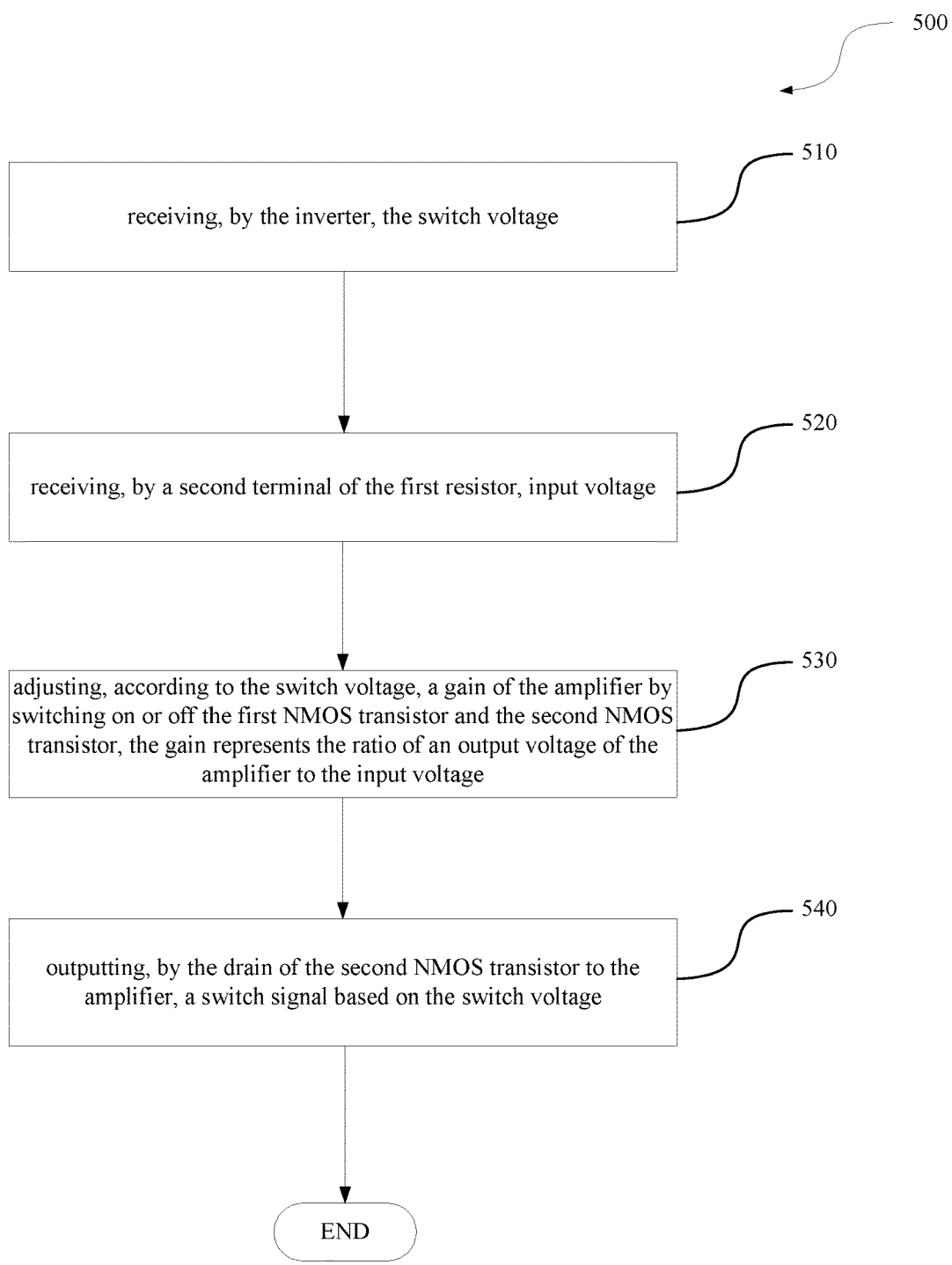
FIG. 5 is a flow chart illustrating a method of controlling a gain of an amplifier according to an embodiment of the invention.

FIG. 5 is a flow chart illustrating a method 500 of controlling a gain of an amplifier according to an embodiment of the invention.

The method 500 in a switch for controlling a gain of an amplifier, where the switch comprises a first NMOS transistor, a second NMOS transistor, a third PMOS transistor, a fourth NMOS transistor, a fifth PMOS transistor, a first resistor, and an inverter; wherein a source of the first NMOS transistor is connected to a first terminal of the first resistor, a drain of the first NMOS transistor is connected to a drain of the third PMOS transistor, a source of the fourth NMOS transistor and a source of the second NMOS transistor, a gate of the first NMOS transistor is connected to a source of the third PMOS transistor, a drain of the fifth PMOS transistor, a drain of the fourth NMOS transistor, and a gate of the second NMOS transistor; a gate of the third PMOS transistor is configured to receive a switch voltage (Vs); a gate of the fourth PMOS transistor is configured to receive a negative switch voltage (Vsn); a gate of the fifth PMOS transistor is connected to an output node of the inverter, a drain of the second NMOS transistor is connected to a negative input node of the amplifier. The method 500 comprises receiving in block 510, by the inverter, the switch voltage; receiving in block 520, by a second terminal of the first resistor, input voltage, adjusting in block 530, according to the switch voltage, a gain of the amplifier by switching on or off the first NMOS transistor and the second NMOS transistor, the gain represents the ratio of an output voltage of the amplifier to the input voltage; and outputting in block 540, by the drain of the second NMOS transistor to the amplifier, a switch signal based on the switch voltage.

Alternatively or additionally, the first NMOS transistor and the second NMOS transistor have a working voltage of about 1.2V.

Alternatively or additionally, the fourth NMOS transistor and the fifth PMOS transistor are I/O devices, and third PMOS transistor, the fourth NMOS transistor and the fifth PMOS transistor have a working voltage of about 2V to 3V.

Alternatively or additionally, the switch voltage is configured to vary between a power source voltage and a ground voltage to adjust a gain of the amplifier by switching on or off the first NMOS transistor and the second NMOS transistor.

Features and aspects of various embodiments may be integrated into other embodiments, and embodiments illustrated in this document may be implemented without all of the features or aspects illustrated or described. One skilled in the art will appreciate that although specific examples and embodiments of the system and methods have been described for purposes of illustration, various modifications can be made without deviating from the spirit and scope of the present invention. Moreover, features of one embodiment may be incorporated into other embodiments, even where those features are not described together in a single embodiment within the present document. Accordingly, the invention is described by the appended claims.

What is claimed is:

1. A switch for controlling a gain of an amplifier, comprising a first NMOS transistor, a second NMOS transistor, a third PMOS transistor, a fourth NMOS transistor, a fifth PMOS transistor, a first resistor, and an inverter; wherein a source of the first NMOS transistor is connected to a first terminal of the first resistor, a drain of the first NMOS transistor is connected to a drain of the third PMOS transistor, a source of the fourth NMOS transistor and a source of the second NMOS transistor, a gate of the first NMOS transistor is connected to a source of the third PMOS transistor, a drain of the fifth PMOS transistor, a drain of the fourth NMOS transistor, and a gate of the second NMOS transistor;

a gate of the third PMOS transistor is configured to receive a switch voltage (Vs);

a gate of the fourth PMOS transistor is configured to receive a negative switch voltage (Vsn);

a gate of the fifth PMOS transistor is connected to an output node of the inverter, and the inverter is configured to receive the switch voltage;

a drain of the second NMOS transistor is connected to a negative input node of the amplifier; and wherein a second terminal of the first resistor is configured to receive an input voltage, and a gain of the amplifier is adjusted according the switch voltage by switching on or off both the first NMOS transistor and the second NMOS transistor together, wherein the gain represents a ratio of an output voltage of the amplifier to the input voltage; wherein the drain of the second NMOS transistor is further configured to output a switch signal based on the switch voltage to the amplifier.

2. The switch of claim 1, wherein both the first NMOS transistor and the second NMOS transistor are core devices, and the first NMOS transistor and the second NMOS transistor have a working voltage of about 1.2V.

3. The switch of claim 1, wherein the third PMOS transistor, the fourth NMOS transistor and the fifth PMOS transistor are I/O devices, and third PMOS transistor, the fourth NMOS transistor and the fifth PMOS transistor have a working voltage of about 2V to 3V.

4. The switch of claim 1, wherein the switch voltage is configured to vary between a power source voltage and a ground voltage to adjust the gain of the amplifier by switching on or off the first NMOS transistor and the second NMOS transistor.

5. A switch assembly for controlling a gain of an amplifier, wherein the switch assembly including a plurality of switches, each switch comprises a first NMOS transistor, a second NMOS transistor, a third PMOS transistor, a fourth NMOS transistor, a fifth PMOS transistor, a first resistor, and an inverter; wherein a source of the first NMOS transistor is connected to a first terminal of the first resistor, a drain of the first NMOS transistor is connected to a drain of the third PMOS transistor, a source of the fourth NMOS transistor and a source of the second NMOS transistor, a gate of the first NMOS transistor is connected to a source of the third PMOS transistor, a drain of the fifth PMOS transistor, a drain of the fourth NMOS transistor, and a gate of the second NMOS transistor;

a gate of the third PMOS transistor is configured to receive a switch voltage (Vs);

a gate of the fourth PMOS transistor is configured to receive a negative switch voltage (Vsn);

a gate of the fifth PMOS transistor is connected to an output node of the inverter, and the inverter is configured to receive the switch voltage;

a drain of the second NMOS transistor is connected to a negative input node of the amplifier; and wherein a second terminal of the first resistor is configured to receive an input voltage (Vin), the drain of the second NMOS transistor is further configured to output a switch signal based on the switch voltage to the amplifier;

wherein the plurality of switches are connected in parallel between the input node of the amplifier and an input node of the switch that receives the input voltage, and the gain of the amplifier is adjusted according the plurality of switch voltages corresponding to the plurality of switches in the switch assembly by switching on or off both the first NMOS transistor and the second NMOS transistor together in each of the switch, wherein the gain represents a ratio of an output voltage of the amplifier to the input voltage.

6. A method in a switch for controlling a gain of an amplifier, where the switch comprises a first NMOS transistor, a second NMOS transistor, a third PMOS transistor, a fourth NMOS transistor, a fifth PMOS transistor, a first resistor, and an inverter; wherein a source of the first NMOS transistor is connected to a first terminal of the first resistor, a drain of the first NMOS transistor is connected to a drain of the third PMOS transistor, a source of the fourth NMOS transistor and a source of the second NMOS transistor, a gate of the first NMOS transistor is connected to a source of the third PMOS transistor, a drain of the fifth PMOS transistor, a drain of the fourth NMOS transistor, and a gate of the second NMOS transistor;

a gate of the third PMOS transistor is configured to receive a switch voltage (Vs);

a gate of the fourth PMOS transistor is configured to receive a negative switch voltage (Vsn);

a gate of the fifth PMOS transistor is connected to an output node of the inverter, and the inverter is configured to receive the switch voltage;

a drain of the second NMOS transistor is connected to a negative input node of the amplifier; and wherein the method comprises:

receiving, by a second terminal of the first resistor, input voltage, and adjusting, according to the switch voltage, the gain of the amplifier by switching on or off the first NMOS transistor and the second NMOS transistor, the gam represents a ratio of an output voltage of the amplifier to the input voltage; and outputting, by the drain of the second NMOS transistor to the amplifier, a switch signal based on the switch voltage.

7. The method of claim 6, wherein the first NMOS transistor and the second NMOS transistor have a working voltage of about 1.2V.

8. The method of claim 6, wherein the third PMOS transistor, the fourth NMOS transistor and the fifth PMOS transistor are I/O devices, and third PMOS transistor, the fourth NMOS transistor and the fifth PMOS transistor have a working voltage of about 2V to 3V.

9. The method of claim 6, wherein the switch voltage is configured to vary between a power source voltage and a ground voltage to adjust the gain of the amplifier by switching on or off the first NMOS transistor and the second NMOS transistor.

* * * * *